United States Patent
Yang et al.

(10) Patent No.: US 12,415,892 B2
(45) Date of Patent: Sep. 16, 2025

(54) POLYIMIDE FILM PREPARATION METHOD AND APPLICATION THEREOF

(71) Applicant: INSTITUTE OF CHEMISTRY CHINESE ACADEMY OF SCIENCES, Beijing (CN)

(72) Inventors: Shiyong Yang, Beijing (CN); Jianjun He, Beijing (CN); Haixia Yang, Beijing (CN); Zhiyuan Wang, Beijing (CN)

(73) Assignee: Institute of Chemistry Chinese Academy of Sciences, Beijing (CN)

( * ) Notice: Subject to any disclaimer, the term of this patent is extended or adjusted under 35 U.S.C. 154(b) by 1022 days.

(21) Appl. No.: 17/600,472

(22) PCT Filed: Apr. 1, 2020

(86) PCT No.: PCT/CN2020/082711
§ 371 (c)(1),
(2) Date: Sep. 30, 2021

(87) PCT Pub. No.: WO2020/200229
PCT Pub. Date: Oct. 8, 2020

(65) Prior Publication Data
US 2022/0177650 A1    Jun. 9, 2022

(30) Foreign Application Priority Data
Apr. 3, 2019   (CN) .......................... 201910264801.1

(51) Int. Cl.
| | |
|---|---|
| *C08G 73/10* | (2006.01) |
| *C08J 5/18* | (2006.01) |
| *C08L 79/08* | (2006.01) |
| *G09F 9/30* | (2006.01) |
| *H05K 1/03* | (2006.01) |

(52) U.S. Cl.
CPC ..... *C08G 73/1028* (2013.01); *C08G 73/1039* (2013.01); *C08G 73/1042* (2013.01); *C08G 73/1067* (2013.01); *C08J 5/18* (2013.01); *C08L 79/08* (2013.01); *G09F 9/301* (2013.01); *H05K 1/0353* (2013.01); *C08J 2379/08* (2013.01); *C08L 2201/10* (2013.01); *C08L 2203/16* (2013.01); *C08L 2203/206* (2013.01)

(58) Field of Classification Search
None
See application file for complete search history.

(56) References Cited

U.S. PATENT DOCUMENTS

| | | | |
|---|---|---|---|
| 4,595,548 A | 6/1986 | St. Clair et al. | |
| 6,232,428 B1 | 5/2001 | Deets et al. | |
| 9,061,474 B2 | 6/2015 | Ju et al. | |
| 2001/0051707 A1* | 12/2001 | Fukuoka | G11B 5/484 528/340 |
| 2007/0191552 A1* | 8/2007 | Ichiroku | C09J 163/00 525/476 |
| 2010/0108943 A1 | 5/2010 | Halper et al. | |
| 2010/0255221 A1* | 10/2010 | Jung | C08J 5/18 428/220 |
| 2012/0135251 A1 | 5/2012 | Jeong et al. | |
| 2018/0148541 A1* | 5/2018 | Ho | C08G 73/122 |

FOREIGN PATENT DOCUMENTS

| | | |
|---|---|---|
| CN | 1306025 | 8/2001 |
| CN | 1970603 | 5/2007 |
| CN | 101796105 | 8/2010 |
| CN | 201210103787.5 | 8/2012 |
| CN | 104211963 | 12/2014 |
| CN | 201710583631.4 | 10/2017 |
| CN | 201810397632.4 | 8/2018 |
| CN | 201810688078.5 | 11/2018 |
| CN | 109134858 | 1/2019 |
| CN | 110092908 | 8/2019 |

\* cited by examiner

*Primary Examiner* — Megan McCulley
(74) *Attorney, Agent, or Firm* — Sand, Sebolt & Wernow Co., LPA

(57) ABSTRACT

Provided are a polyimide film, preparation method, and application thereof. The polyimide film is a colorless transparent film with low thermal expansion. The polyimide film is obtained by taking a mixture of rigid aromatic diamine and fluorine-containing aromatic diamine, a mixture of rigid aromatic tetracarboxylic dianhydride and fluorine-containing aromatic tetracarboxylic dianhydride as raw materials, mixing the raw materials to obtain a resin solution, and then conducting imidizing and post-treating. The polyimide film not only has excellent transparency, but also has the advantages of low thermal expansion, high modulus, high glass transition temperature, and so on, and can be well applied to a flexible optoelectronic display substrate, a flexible printed circuit board, or an electronic packaging substrate.

15 Claims, 2 Drawing Sheets

POLYIMIDE FILM PREPARATION METHOD AND APPLICATION THEREOF

TECHNICAL FIELD

The disclosure relates to the technical field of polymer films, particularly, relates to a polyimide film and preparation method and application thereof.

BACKGROUND

Aromatic polyimide (PI) film has the advantages of high temperature resistance, low temperature resistance, corrosion resistance, high insulation, low dielectric constant and low dielectric loss, and excellent mechanical properties and so on. It has been widely used in high-tech fields such as flexible printed circuits, flexible optoelectronic displays, aerospace, semiconductor manufacturing, and packaging, and so on. Typical applications include surface passivation of IC chips, interlayer insulation of multilayer interconnection structures, signal line distribution of packaging substrates for advanced microelectronics packaging, ball making process of micro solder balls, stress buffering internal coating protective thin film for plastic packaging circuits, the manufacturing process of liquid crystal flat panel displays and other aspects. In recent years, with the rapid development of flexible optoelectronic display technology, the electronic industry has an urgent application demand for colorless and transparent polyimide films.

Due to the charge interaction of in and between backbone structures of the resin, traditional aromatic polyimide films are generally yellow or yellowish brown. By introducing bulky side chains, fluorine-containing groups, and flexible segments, etc. into the backbone structures of the resin to break the charge interaction of the resin, the colorless and transparent aromatic polyimide film can be realized.

Anne K. St. Clair et al. (U.S. Pat. No. 4,595,548) discloses a colorless and transparent polyimide film. A polyamic acid resin solution without inter-chain charge interaction was formed by polycondensation of an aromatic tetraacid dianhydride containing an aromatic ether or aromatic sulfide and an aromatic diamine containing meta-substitution or ortho-, para-substitution. Then the polyamic acid resin solution was coated and imidized at high temperature to obtain a colorless and transparent polyimide film. Gary L. Deets et al. (U.S. Pat. No. 6,232,428) discloses a colorless and transparent polyimide film, which is formed by high-temperature imidization of a polyamic acid resin solution after coating. And the polyamic acid resin solution was formed by polycondensation of an aromatic tetraacid dianhydride and a para-substituted aromatic diamine. Fan Lin et al. (CN 201210103787.5) discloses a method for preparing a colorless and highly transparent polyimide film. The alicyclic dianhydride and the sulfone group-containing aromatic diamine were polycondensed to form a semi-aromatic polyamic acid resin, and then the semi-aromatic polyamic acid resin was thermally imidized to form a semi-aromatic polyimide film. The film has excellent optical transparency, can realize the colorless transparency under high thickness (≤100 μm), the initial light transmission wavelength is below 300 nm, and the light transmittance in the visible light region is ≤90%. Lu Qinghua et al. (CN 201810397632.4) disclosed a method for preparing a colorless and transparent polyimide film. A polyamic acid solution was formed by polycondensation of the mixture of aromatic tetraacid dianhydride and alicyclic tetraacid dianhydride and fluorine-containing aromatic diamine, then was coated on the surface of a glass plate substrate, and was placed in a vacuum oven to be heated to 270° C. to remove the solvent and perform a thermal imidization reaction. After cooling, a transparent polyimide film was obtained. Yu ping et al. (CN 201810688078.5) discloses a method for preparing a colorless and transparent film of fully aromatic. A polyamic acid solution was synthesized by polycondensation reaction of diamine monomers with trifluoromethyl side groups and intermediate ether linkages and isomeric dianhydride monomers with ether linkages in the middle, and then thermoplastic polyimide material was synthesized by chemical imidization method. Finally a polyimide film was prepared by dissolving, coating, and evaporating the solvent. Yang Lu et al. (CN201710583631.4) disclosed a method for preparing a colorless and transparent polyimide film. Aromatic tetraacid dianhydride and aromatic diamine were polycondensated to form a polyamic acid resin solution at a molar ratio of 1:1, then an imidization reagent was add. After mixing, defoaming, coating, imidization under heating, polyimide film was obtained. The glass transition temperature (Tg) of the polyimide film is up to 298° C., light transmittance (450 nm) is up to 95%. Chul Ha Ju et al. (U.S. Pat. No. 9,061,474 B2) disclosed a method for improving the tensile strength of transparent polyimide films. A polyamic acid resin solution was formed by copolymerization of aromatic tetraacid dianhydride mixture and the fluorine-containing aromatic diamine. After adding silicone resin, the transparent polyimide film was formed by coating and high-temperature imidization reaction. The tear strength of the polyimide film is up to 184.6 N/mm and thermal expansion coefficient (50-250° C.) of the polyimide film is as low as 40.93 ppm/° C.

Although some of the colorless and transparent polyimide films disclosed above have excellent transparency, their thermal expansion coefficient is high 40.93 ppm/° C.). And some of the thin films have excellent transparency, but their glass transition temperature is low (≥300° C.). The flexible printed circuit formed by the combination of the transparent polyimide film and metal (such as copper foil), or the transparent photoelectric substrate formed by the transparent polyimide film and transparent oxide electrode (such as indium oxide (ITO), etc.) is easy to warp, deform or even fall off after being impacted by high and low temperature environments, which severely restrict their practical use in the field of flexible printed circuits and flexible optoelectronic displays In view of this, the present disclosure is proposed.

SUMMARY

The technical problem to be solved by the present disclosure is to overcome the shortcomings of the prior art, and the present disclosure provides a polyimide film and preparation method and application thereof.

The first object of the present disclosure is to provide a polyimide film. The polyimide film is colorless and transparent. It not only has excellent transparency, but also has low thermal expansion, high modulus, and high glass transition temperature. It can be better applied to flexible optoelectronic display substrates, flexible printed circuit boards or electronic packaging substrates.

To solve the above technical problems, the basic idea of the present disclosure is as following:

A polyimide film is provided, the polyimide film is a colorless transparent film with low thermal expansion, and the polyimide film is obtained by taking a mixture of rigid aromatic diamine and fluorine-containing aromatic diamine, a mixture of rigid aromatic tetracarboxylic dianhydride and fluorine-containing aromatic tetracarboxylic dianhydride as raw materials, mixing the raw materials to obtain a resin solution, and conducting imidizing and post-treating.

The polyimide film prepared by the disclosure not only has good linear thermal expansion coefficient, but also has excellent transparency, and has a very broad application prospect in the field of flexible and transparent electronic packaging materials.

As an embodiment, in the mixture of rigid aromatic diamine and fluorine-containing aromatic diamine, a molar ratio of rigid aromatic diamine and fluorine-containing aromatic diamine is in a range of 0~10:100~60.

As an embodiment, in the mixture of rigid aromatic tetracarboxylic dianhydride and fluorine-containing aromatic tetracarboxylic dianhydride, a molar ratio of the fluorine-containing aromatic tetracarboxylic dianhydride and the rigid aromatic tetracarboxylic dianhydride is in a range of 0~50:100~50.

As an embodiment, the rigid aromatic diamine is one or more components selected from a group containing 1,4-p-phenylenediamine, 4,4'-biphenyldiamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl or 2,2',3,3'-tetramethyl-4,4'-diaminobiphenyl.

The rigid aromatic diamine above can increase the rigidity of the resin main chain structure, and reduce the linear thermal expansion coefficient of the material, and increase the glass transition temperature, and improve the mechanical strength.

As an embodiment, the fluorine-containing aromatic diamine is one or more components selected from a group containing 1,4-bis (2-trifluoromethyl-4-aminophenoxy) benzene, 1,3-bis (2-trifluoromethyl-4-aminophenoxy) benzene, 4,4'-bis (2-trifluoromethyl-4-aminophenoxy) biphenyl, 2,2'-bistrifluoromethyl-4,4'-diaminobiphenyl, 3,3'-bistrifluoromethyl-5,5'-diaminobiphenyl, 2,2-bis (4-aminophenoxybenzene) hexafluoropropane, 3-trifluoromethyl m-phenylenediamine, tetrafluorop-phenylenediamine, tetrafluorom-phenylenediamine, 4,4'-octafluorobenzidine or 4,4'-diaminooctafluorodiphenyl ether.

The fluorine-containing aromatic diamine above can reduce the polarity of the resin main chain structure, and reduce the charge transfer effect between molecules, and improve the transparency of the material, and reduce the water absorption rate.

As an embodiment, the rigid aromatic tetracarboxylic dianhydride is one or more components selected from a group containing pyromellitic dianhydride, 3,3',4,4'-biphenyltetracarboxylic dianhydride, 2,3,3',4'-biphenyltetracarboxylic dianhydride and 3,3',4,4'-benzophenone tetracarboxylic dianhydride.

The rigid aromatic dianhydride above can increase the rigidity of the resin main chain structure, and reduce the linear thermal expansion coefficient of the material, and increase the glass transition temperature, and improve the mechanical strength.

As an embodiment, the fluorine-containing aromatic tetracarboxylic dianhydride is one or more components selected from a group containing 4,4'-(hexafluoroisopropyl) diphthalic anhydride, 4,4'-(trifluoromethylphenylisopropyl) diphthalic anhydride, 4,4'-(trifluoromethyl-m-trifluoromethylphenyl-isopropyl) diphthalic anhydride, 4,4'-(trifluoromethyl-m, m-bistrifluoromethylphenyl-isopropyl) diphthalic anhydride.

The fluorine-containing aromatic dianhydride can reduce the polarity of the resin main chain structure, and reduce the charge transfer effect between molecules, and improve the transparency of the material, and reduce the water absorption rate.

As an embodiment, the raw materials for preparation of the polyimide film includes a molecular weight regulator, the molecular weight regulator is one or more selected components from a group containing phthalic anhydride, hydrogenated phthalic anhydride, 4-phenylacetylene phthalic anhydride, hydrogenated 4-toluene anhydride, 3-chlorophthalic anhydride, 3-bromophthalic anhydride, 4-chlorophthalic anhydride, 4-bromophthalic anhydride, perchlorophthalic anhydride, perbromophthalic anhydride, 3,4-dichlorophthalic anhydride, 3,4-dibromophthalic anhydride, aniline, 4-phenylethynylaniline and 3-phenylethynylaniline.

As an embodiment, a molar ratio of the rigid aromatic diamine, the fluorine-containing aromatic diamine, the rigid aromatic tetracarboxylic dianhydride, the fluorine-containing aromatic tetracarboxylic dianhydride, and the molecular weight regulator is 100:99:1~99:99:1.

When the proportion of fluorine-containing monomer is small, the transparency of the film is poor; when the proportion of rigid monomer is small, the linear thermal expansion coefficient of the thin film is high. When there are more molecular weight regulators, the resin has a low molecular weight and poor performance; when there are fewer molecular weight regulators, the resin has a high viscosity, which is not conducive to processing of the film. By adding corresponding substances according to the above proportion, various properties of the film can be coordinated to obtain a transparent film with excellent performance.

preferably, the light transmittance of the polyimide film of the present disclosure is greater than or equal to 80% at 450 nm, the light transmittance is greater than or equal to 82% at 500 nm, the thermal expansion coefficient of 50-200° C. is less than or equal to 22 ppm/° C., the tensile modulus is greater than or equal to 3.5 GPa, and Tg is greater than or equal to 300° C.

Another object of the present disclosure is to provide a method for preparing the polyimide film, comprising following steps:

(1) adding a solid powder of a mixture of rigid aromatic diamine and fluorine-containing aromatic diamine to an organic solvent to obtain a first homogeneous solution, and adding a solid powder of a mixture of rigid aromatic tetracarboxylic dianhydride and fluorine-containing aromatic tetracarboxylic dianhydride to the first homogeneous solution for several times, stirring to form a second homogeneous solution, adding a molecular weight regulator to the second homogeneous solution and continuing stirring to obtain a polyamic acid resin solution;

(2) adding an imidization reagent to a certain amount of the polyamic acid resin solution, being subject to defoaming in vacuum, mixing evenly to form a mixture, coating the mixture on a plane, and heating to form a semi-cured film;

(3) peeling off the semi-cured film, conducting high temperature treatment when a periphery of the semi-cured film is fixed or under an action of biaxial tension, and cooling after imidization reaction to obtain a polyimide film with colorless and transparent.

As an embodiment, the organic solvent is one or more solvents selected from a group containing N-methylpyrrolidone, N,N'-dimethylacetamide, N,N'-dimethylformamide, dimethylsulfoxide, γ-butyrolactone, ethyl lactate, cyclopentanone, cyclohexane ketone, methyl ethyl ketone, ethyl acetate or butyl acetate.

As an embodiment, the imidization reagent is a mixture of organic acid anhydride and organic base, it can select from acetic anhydride/pyridine mixture, acetic anhydride/2-methylpyridine mixture, acetic anhydride/3-methylpyridine mixture, acetic anhydride/4-methylpyridine mixture, acetic anhydride/2,3-lutidine mixture, acetic anhydride/2,4-lutidine mixture, acetic anhydride/2,6-lutidine mixture, acetic anhydride/quinoline mixture, acetic anhydride/isoquinoline mixture or acetic anhydride/pyrrole mixture.

As an embodiment, in the preparation method, an amount of the imidization reagent added is in a range of 0-100% of the weight of the polyamic acid resin solution.

The addition of the imidization reagent can make the polyamic acid solution pre-orientate before coating, which is beneficial to the arrangement of molecules in the plane and obtains a polyimide film with more excellent comprehensive performance. If the amount of the imidization reagent is too small, the linear thermal expansion coefficient of the thin film will be high; if the amount of the imidization reagent is too much, the polyamic acid solution will gel, which is unfavorable to processing of this film. The above-mentioned addition ratio not only facilitates the processing of the film, but also makes the film have a relatively high linear thermal expansion coefficient.

Preferably, a content of solvent in the semi-cured film is in a range from 10 wt % to 40 wt %.

When the solvent in the semi-cured film is less than 10 wt %, the toughness of the semi-cured film is too poor to be fixed on two or four sides to achieve complete imidization of the film; when the solvent in the semi-cured thin film is more than 40 wt %, the semi-cured film is too soft, and it is difficult to fix on both sides or around it, and it is impossible to achieve complete imidization of the film.

Preferably, the temperature of high temperature treatment is in a range from 200° C. to 450° C., and the treatment time is in a range from 1 min to 120 min, and the thickness of polyimide film is in a range from 7.5 µm to 100 µm.

The preparation of polyimide film requires programmed temperature rise. First, the film will volatilize solvent molecules, and the processing temperature and time will affect the speed of solvent volatilization. Then the film will be imidized at high temperature and change from semi cured film containing some solvent to final finished polyimide film. If the treatment temperature is lower than 200° C. and the time is less than 1 min, the solvent cannot be completely volatilized; if the treatment temperature is higher than 450° C. and the time is more than 120 min, then it will cause problems such as thermal decomposition of the thin film and yellowing of the color.

As an embodiment, the rigid aromatic diamine is one or more components selected from a group containing 1,4-p-phenylenediamine, 4,4'-biphenyldiamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl and 2,2',3,3'-tetramethyl-4,4'-diaminobiphenyl.

As an embodiment, the fluorine-containing aromatic diamine is one or more components selected from a group containing 1,4-bis (2-trifluoromethyl-4-aminophenoxy) benzene, 1,3-bis (2-trifluoromethyl-4-aminophenoxy) benzene, 4,4'-bis (2-trifluoromethyl-4-aminophenoxy) biphenyl, 2,2'-bistrifluoromethyl-4,4'-diaminobiphenyl, 3,3'-bistrifluoromethyl-5,5'-diaminobiphenyl, 2,2-bis (4-aminophenoxybenzene) hexafluoropropane, 3-trifluoromethyl m-phenylenediamine, tetrafluorop-phenylenediamine, tetrafluorom-phenylenediamine, 4,4'-octafluorobenzidine and 4,4'-diaminooctafluorodiphenyl ether.

As an embodiment, the rigid aromatic tetracarboxylic dianhydride is one or more selected from a group containing pyromellitic dianhydride, 3,3',4,4'-biphenyltetracarboxylic dianhydride, 2,3,3',4'-biphenyltetracarboxylic dianhydride and 3,3',4,4'-benzophenone tetracarboxylic dianhydride.

As an embodiment, the fluorine-containing aromatic tetracarboxylic dianhydride is one or more components selected from a group containing 4,4'-(hexafluoroisopropyl) diphthalic anhydride, 4,4'-(trifluoromethylphenylisopropyl) diphthalic anhydride, 4,4'-(trifluoromethyl-m-trifluoromethylphenyl-isopropyl) diphthalic anhydride, 4,4'-(trifluoromethyl-m, m-bistrifluoromethylphenyl-isopropyl) diphthalic anhydride.

Preferably, in the mixture of rigid aromatic diamine and fluorine-containing aromatic diamine, the molar ratio of the rigid aromatic diamine and the fluorine-containing aromatic diamine is in a range of 0-40:100-60; in the mixture of rigid aromatic tetracarboxylic dianhydride and fluorine-containing aromatic tetracarboxylic dianhydride, the molar ratio of the fluorine-containing aromatic tetracarboxylic dianhydride and the rigid aromatic tetracarboxylic dianhydride is in a range of 0-50:100-50.

When making copper clad laminates, it is necessary to ensure that the linear thermal expansion coefficient of the polyimide film is close to that of copper, otherwise, the copper clad laminates will be bent, and peeled, etc. due to the different degrees of expansion of different materials during high temperature processing. The linear thermal expansion coefficient of the thin film will meet the requirements after the addition amount reaches a certain level. Therefore, we only study the case where the rigid monomer content is greater than a certain critical value. In the disclosure, when the ratio of rigid monomer and fluorine-containing monomer is greater than 50:50, the linear thermal expansion coefficient can be guaranteed to be less than 20 ppm.

According to the method for preparing polyimide film in the present disclosure, the polyimide film obtained not only has excellent transparency, but also has the advantages of low thermal expansion coefficient, and high modulus, and high glass transition temperature. And the light transmittance at 450 nm is greater than or equal to 80%, the light transmittance at 500 nm is greater than or equal to 82%, the coefficient of thermal expansion (CTE, 50-200° C.) is less than or equal to 22 ppm/° C., the tensile modulus is greater than or equal to 3.5 GPa, and Tg is greater than or equal to 300° C.

Another object of the present disclosure is to provide an application of the polyimide film according to the above content. The polyimide film is applied as a part of a flexible photoelectric display substrate, a printed circuit board, or an electronic packaging substrate.

As an embodiment, the polyimide film on which an oxide electrode layer or a metal layer is deposited after the surface of the polyimide film is activated, is applied as a flexible photoelectric display substrate or a transparent flexible printed circuit board or a flexible electronic packaging substrate.

Preferably, the oxide electrode layer is an ITO transparent electrode, and the metal layer is a copper layer.

As an embodiment, after the surface of the polyimide film is activated, the metal layer will be adhesion-promoted by ion implantation or magnetron sputtering, and then the ITO transparent electrode is vacuum deposited to form a double-sided flexible transparent conductive thin film (ITO/PI/ITO), its surface resistivity is ≥20Ω/□, so it can be used for transparent flexible photoelectric display substrates.

As an embodiment, after the surface of the polyimide film is activated, the metal layer will be adhesion-promoted by ion implantation or magnetron sputtering, and then the metal copper layer is vacuum deposited to form a double-sided transparent PI thin film copper clad laminate (Cu/PI/Cu), the peel strength between the surface and the copper layer is ≤0.5 N/mm, which is used for transparent flexible printed circuit boards or flexible electronic packaging substrates.

DESCRIPTION OF THE DRAWINGS

The drawings are used to provide a further understanding of the present disclosure. The embodiments and descriptions are used to explain the present disclosure, but do not constitute an improper limitation of the present disclosure. Obviously, the drawings in the following description are only some embodiments, and for those of ordinary skill in this art, other drawings can be obtained based on these drawings without creative work. In the drawings.

It should be noted that these drawings and descriptions are not intended to limit the scope of the present disclosure in any way, but to explain the concept of the present disclosure for those skilled in this art by referring to specific embodiments.

DETAILED DESCRIPTION OF THE EMBODIMENTS

Specific embodiments of the present disclosure are only limited to further describe and declare the present disclosure, but not to confine contents of the present disclosure.

Embodiment 1

A 500 ml three-necked round bottom flask is equipped with a mechanical stirrer, a thermometer, and a nitrogen protection device. 200 ml of NMP (N-methylpyrrolidone), and 28.82 g of (0.09 mol) TFDB (2,2'-bistrifluoromethyl-4,4'-diaminobiphenyl), and 2.00 g of (0.01 mol) ODA (4,4'-diaminodiphenyl ether) were added into the three-necked round bottom flask. All the solids were dissolved under stirring and nitrogen protection to form a homogeneous solution. After the round bottom flask was cooled to 0-5° C. with an ice bath, 4.44 g of (0.01 mol) 6FDA (4,4'-(hexafluoroisopropyl) diphthalic anhydride) and 26.48 g of (0.09 mol) BPDA (3,3',4,4'-biphenyltetracarboxylic dianhydride) solid powder were added to the above homogeneous solution for several times while stirring. After the solids were completely dissolved, stirring was continued for 24 hours to obtain a viscous homogeneous polyamic acid resin (PAA-1) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, and heated to 60° C. for 1 hand 120° C. for 10 min, then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 85.6% and 88.6%, respectively, the Tg is 354.6° C., and the coefficient of thermal expansion (CTE, 50-200° C.) is 4.2 ppm/° C., and the tensile modulus is 6.4 GPa.

Figure 1:
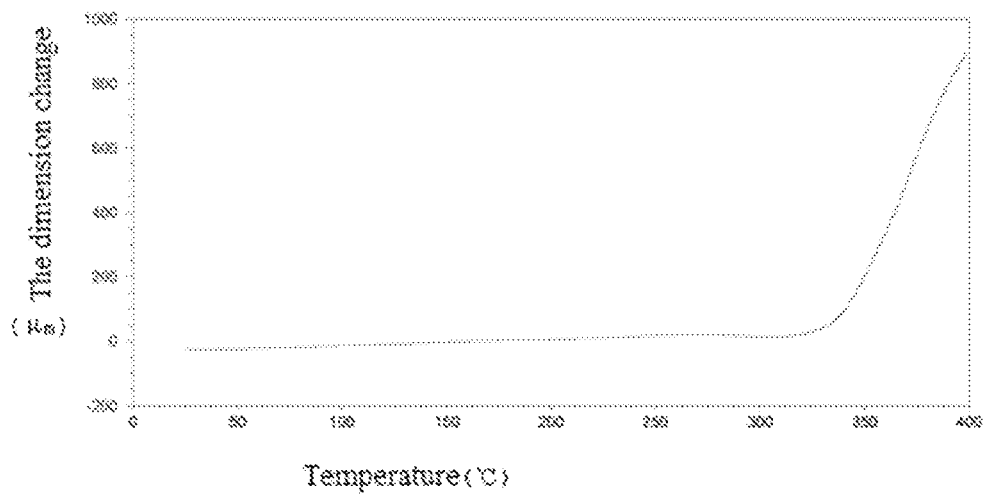
FIG. 1 is the TMA curve (material dimensional stability curve) of the colorless transparent polyimide film with low thermal expansion obtained in embodiment 1 of the present disclosure.
Figure 2:
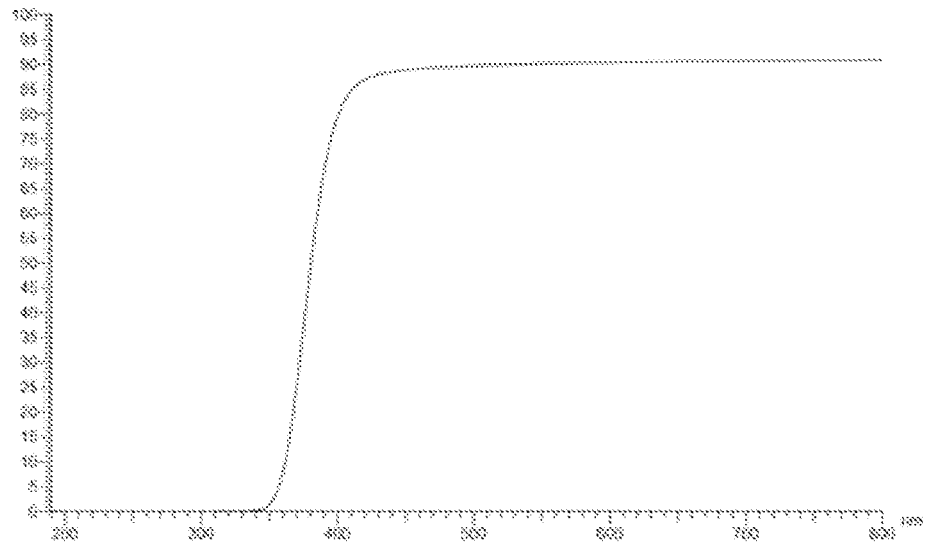
FIG. 2 is the UV-Vis spectrum of the colorless transparent polyimide film with low thermal expansion obtained in embodiment 1 of the present disclosure.
Figure 3:
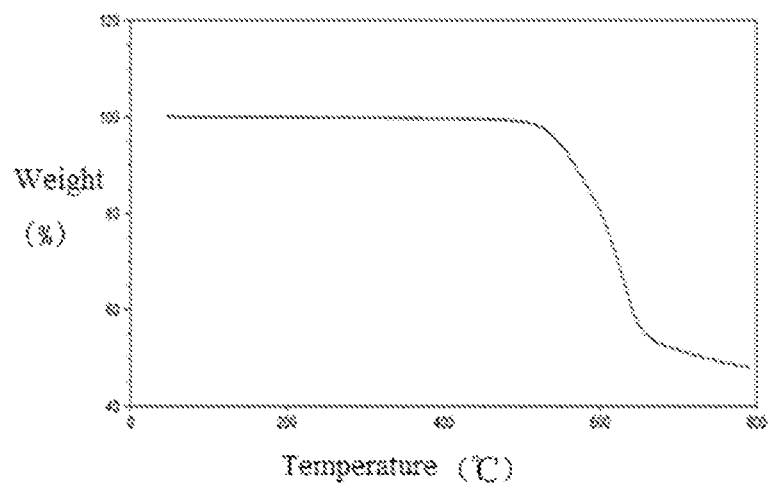
FIG. 3 is the TGA curve (thermogravimetric analysis curve) of the colorless transparent polyimide film with low thermal expansion obtained in embodiment 1 of the present disclosure.

The TMA curve of the colorless and transparent polyimide film with low thermal expansion obtained above is shown in FIG. 1, the ultraviolet-visible spectrum is shown in FIG. 2, and the TGA curve is shown in FIG. 3.

Embodiment 2

A 500 ml three-necked round bottom flask is equipped with a mechanical stirrer, a thermometer, and a nitrogen protection device. 200 ml of NMP (N-methylpyrrolidone), and 17.13 g of (0.04 mol) 6FAPB (1,4-bis(2-trifluoromethyl-4-aminophenoxy)benzene), and 15.26 g of (0.06 mol) TMMDA (3,3',5,5'-tetramethyl-4,4'-diaminodiphenylmethane) were added into the three-necked round bottom flask. All the solids were dissolved under stirring and nitrogen protection to form a homogeneous solution. After the round bottom flask was cooled to 0-5° C. with an ice bath, 11.31 g of (0.025 mol) 3FDA (4,4'-(trifluoromethylphenylisopropyl) and 22.07 g of (0.075 mol) BPDA (3,3',4,4'-biphenyltetracarboxylic dianhydride) solid powder were added to the above homogeneous solution for several times while stirring. After the solids were completely dissolved, stirring was continued for 24 hours to obtain a viscous homogeneous polyamic acid resin (PAA-1) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, and heated to 60° C. for 1 h and 120° C. for 10 min, then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 85.7% and 87.2%, respectively, the Tg is 366.6° C., and the coefficient of thermal expansion (CTE, 50-200° C.) is 14.8 ppm/° C., and the tensile modulus is 4.4 GPa.

Embodiment 3

A 500 ml three-necked round bottom flask is equipped with a mechanical stirrer, a thermometer, and a nitrogen protection device. 200 ml of NMP (N-methylpyrrolidone), and 24.02 g of (0.075 mol) TFDB (2,2'-bistrifluoromethyl-4,4'-diaminobiphenyl), and 5.01 g of (0.025 mol) 3,4-ODA (3,4'-diaminodiphenyl ether) were added into the three-necked round bottom flask. All the solids were dissolved under stirring and nitrogen protection to form a homogeneous solution. After the round bottom flask was cooled to 0-5° C. with an ice bath, 20.81 g of (0.04 mol) 6FBA (4,4'-(trifluoromethyl-m-trifluoromethylphenyl-isopropyl) and 17.65 g of (0.06 mol) BPDA (3,3',4,4'-biphenyltetracarboxylic dianhydride) solid powder were added to the above homogeneous solution for several times while stirring. After the solids were completely dissolved, the reaction was continued for 24 hours with stirring to obtain a viscous homogeneous polyamic acid resin (PAA-1) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, and heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 88.2% and 92.4%, respectively, the Tg is 352.6° C., and the coefficient of thermal expansion (CTE, 50-200° C.) is 17.2 ppm/° C., and the tensile modulus is 4.0 GPa.

Embodiment 4

A 500 ml three-necked round bottom flask is equipped with a mechanical stirrer, a thermometer, and a nitrogen protection device. 200 ml of NMP (N-methylpyrrolidone), and 28.82 g of (0.09 mol) TFDB (2,2'-bistrifluoromethyl-4,4'-diaminobiphenyl), and 5.04 g of (0.01 mol) 6FBAB (4,4'-bis(2-trifluoromethyl-4-aminophenoxy)biphenyl) were added into the three-necked round bottom flask. All the solids were dissolved under stirring and nitrogen protection to form a homogeneous solution. After the round bottom flask was cooled to 0-5° C. with an ice bath, 22.21 g of (0.05 mol) 6FDA (4,4'-(hexafluoroisopropyl) diphthalic anhydride) and 14.71 g of (0.05 mol) BPDA (3,3',4,4'-biphenyltetracarboxylic dianhydride) solid powder were added to the above homogeneous solution for several times while stirring. After the solids were completely dissolved, the reaction was continued for 24 hours with stirring to obtain a viscous homogeneous polyamic acid resin (PAA-1) solution.

100 g of the above PAA resin solution was put into a 200 ml glass flask, 20 g of mixture of acetic anhydride and pyridine (2/1 molar ratio) was added under stirring. Then solution was mixed uniformly, then filtered by pressure and defoamed by vacuum. And then the resin solution was coated on the surface of the glass plate, and heated (60° C./1 h+120° C./10 min), then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 86.8% and 88.8%, respectively, the Tg is 346.5° C., and the coefficient of thermal expansion (CTE, 50-200° C.) is 21.3 ppm/° C., and the tensile modulus is 3.5 GPa.

Embodiment 5

A 500 ml three-necked round bottom flask is equipped with a mechanical stirrer, a thermometer, and a nitrogen protection device. 200 ml of NMP (N-methylpyrrolidone), and 28.82 g of (0.09 mol) TFDB (2,2'-bistrifluoromethyl-4,4'-diaminobiphenyl), and 2.00 g of (0.01 mol) ODA (4,4'-diaminodiphenyl ether) were added into the three-necked round bottom flask. All the solids were dissolved under stirring and nitrogen protection to form a homogeneous solution. After the round bottom flask was cooled to 0-5° C. with an ice bath, 13.33 g of (0.03 mol) 6FDA (4,4'-(hexafluoroisopropyl) diphthalic anhydride) and 15.27 g of (0.07 mol) PMDA (pyromellitic dianhydride) solid powder were added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure and defoamed vy vacuum. Then the resin solution was coated on the surface of the glass plate, and heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 85.4% and 88.4%, respectively, the Tg is 387.2° C., and the coefficient of thermal expansion (CTE, 50-200° C.) is 12.6 ppm/° C., and the tensile modulus is 5.6 GPa.

Embodiment 6

A 500 ml three-necked round bottom flask is equipped with a mechanical stirrer, a thermometer, and a nitrogen protection device. 200 ml of NMP (N-methylpyrrolidone), and 12.81 g of (0.04 mol) TFDB (2,2'-bistrifluoromethyl-4,4'-diaminobiphenyl), and 15.26 g of (0.06 mol) TMMDA (3,3',5,5'-tetramethyl-4,4'-diaminodiphenylmethane) were added into the three-necked round bottom flask. All the solids were dissolved under stirring and nitrogen protection to form a homogeneous solution. After the round bottom flask was cooled to 0-5° C. with an ice bath, 23.53 g of (0.04 mol) 9FDA (4,4'-(trifluoromethyl-m, m-bistrifluoromethylphenyl-isopropyl) and 13.09 g of (0.06 mol) PMDA (pyromellitic dianhydride) solid powder were added to the above homogeneous solution for several times while stirring. After the solids were completely dissolved, stirring was continued for 24 hours to obtain a viscous homogeneous polyamic acid resin (PAA) solution.

100 g of the above PAA resin solution was put into a 200 ml glass flask, and 20 g of mixture of acetic anhydride and pyridine (2/1 molar ratio) were added under stirring. Then solution was mixed uniformly, filtered by pressure, and defoamed by vacuum. And then the resin solution was coated on the surface of the glass plate, heated to 60° C. for 1 h and 120° C. for 10 min. Then the semi-cured film formed was peeled off from the surface of the glass plate;

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 92.5% and 96.8%, respectively, the Tg is 355.0° C., and the coefficient of thermal expansion (CTE, 50-200° C.) is 18.0 ppm/° C., and the tensile modulus is 4.8 GPa.

Embodiment 7

A 500 ml three-necked round bottom flask is equipped with a mechanical stirrer, a thermometer, and a nitrogen protection device. 200 ml of NMP (N-methylpyrrolidone), and 35.31 g of (0.07 mol) 6FBAB (4,4'-bis(2-trifluoromethyl-4-aminophenoxy)biphenyl), and 7.63 g of (0.03 mol) TMMDA (3,3',5,5'-tetramethyl-4,4'-diaminodiphenylmethane) were added into the three-necked round bottom flask. All the solids were dissolved under stirring and nitrogen protection to form a homogeneous solution. After the round bottom flask was cooled to 0-5° C. with an ice bath, 22.21 g of (0.05 mol) 6FDA (4,4'-(hexafluoroisopropyl) diphthalic anhydride) and 10.91 g of (0.05 mol) PMDA (pyromellitic dianhydride) solid powder were added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into a 200 ml glass flask, 20 g of mixture of acetic anhydride and pyridine (2/1 molar ratio) was added under stirring. Then solution was mixed uniformly, then filtered by pressure and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 86.4% and 89.2%, respectively, the Tg is 402.3° C., and the coefficient of thermal expansion (CTE, 50-200° C.) is 22.0 ppm/° C., and the tensile modulus is 4.7 GPa.

Embodiment 8

A 500 ml three-necked round bottom flask is equipped with a mechanical stirrer, a thermometer, and a nitrogen protection device. 200 ml of NMP (N-methylpyrrolidone), and 32.02 g of (0.10 mol) TFDB (2,2'-bistrifluoromethyl-4,4'-diaminobiphenyl) were added into the three-necked round bottom flask. All the solids were dissolved under stirring and nitrogen protection to form a homogeneous solution. After the round bottom flask was cooled to 0-5° C. with an ice bath, 14.71 g of (0.05 mol) BPDA (3,3',4,4'-biphenyltetracarboxylic dianhydride) and 10.91 g of (0.05 mol) PMDA (pyromellitic dianhydride) solid powder were added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 83.4% and 88.7%, respectively, the Tg is 373.4° C., and the coefficient of thermal expansion (CTE, 50-200° C.) is 2.4 ppm/° C., and the tensile modulus is 7.0 GPa.

Embodiment 9

A 500 ml three-necked round bottom flask is equipped with a mechanical stirrer, a thermometer, and a nitrogen protection device. 200 ml of NMP (N-methylpyrrolidone), and 32.02 g of (0.10 mol) TFDB (2,2'-bistrifluoromethyl-4,4'-diaminobiphenyl) were added into the three-necked round bottom flask. All the solids were dissolved under stirring and nitrogen protection to form a homogeneous solution. After the round bottom flask was cooled to 0-5° C. with an ice bath, 29.42 g of (0.10 mol) BPDA (3,3',4,4'-biphenyltetracarboxylic dianhydride) solid powder was added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 81.7% and 84.0%, respectively, the Tg is 313.3° C., and the coefficient of thermal expansion (CTE, 50-200° C.) is −2.0 ppm/° C., and the tensile modulus is 6.3 GPa.

Embodiment 10

A 500 ml three-necked round bottom flask is equipped with a mechanical stirrer, a thermometer, and a nitrogen protection device. 200 ml of NMP (N-methylpyrrolidone), and 32.02 g of (0.10 mol) TFDB (2,2'-bistrifluoromethyl-4,4'-diaminobiphenyl) were added into the three-necked round bottom flask. All the solids were dissolved under stirring and nitrogen protection to form a homogeneous solution. After the round bottom flask was cooled to 0-5° C. with an ice bath, 21.81 g of (0.10 mol) PMDA (pyromellitic dianhydride) solid powder was added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 81.4% and 84.0%, respectively, the coefficient of thermal expansion (CTE, 50-200° C.) is −17.0 ppm/° C., and the tensile modulus is 17.2 GPa.

Comparative Example 1

A 500 ml three-necked round bottom flask is equipped with a mechanical stirrer, a thermometer, and a nitrogen protection device, 200 ml of NMP (N-methylpyrrolidone), and 32.02 g of (0.10 mol) TFDB (2,2'-bistrifluoromethyl-4,4'-diaminobiphenyl) were added into the three-necked round bottom flask. All the solids were dissolved under stirring and nitrogen protection to form a homogeneous solution. After the round bottom flask was cooled to 0-5° C. with an ice bath, 44.42 g of (0.10 mol) 6FDA (4,4'-(hexafluoroisopropyl) solid powder was added to the above homogeneous solution for several times while stirring. After the solids were completely dissolved, the reaction was continued for 24 hours with stirring to obtain a viscous homogeneous polyamic acid resin (PAA) solution.

100 g of the above PAA resin solution was put into in a 200 ml glass flask, and 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, heated to 60° C. for 1 h and to 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 81.4% and 84.0%, respectively, the Tg is 349.2° C., and the coefficient of thermal expansion (CTE, 50-200° C.) is 43.4 ppm/° C., and the tensile modulus is 3.2 GPa.

Comparative Example 2

A 500 ml three-necked round bottom flask is equipped with a mechanical stirrer, a thermometer, and a nitrogen protection device. 200 ml of NMP (N-methylpyrrolidone), and 12.81 g of (0.04 mol) TFDB (2,2'-bistrifluoromethyl-4,4'-diaminobiphenyl), and 30.27 g of (0.06 mol) 6FBAB (4,4'-bis(2-trifluoromethyl-4-aminophenoxy)biphenyl) were added into the three-necked round bottom flask. All the solids were dissolved under stirring and nitrogen protection to form a homogeneous solution. After the round bottom flask was cooled to 0-5° C. with an ice bath, 22.21 g of (0.05 mol) 6FDA (4,4'-(hexafluoroisopropyl) diphthalic anhydride) and 14.71 g of (0.05 mol) BPDA (3,3',4,4'-biphenyltetracarboxylic dianhydride) solid powder were added to the above homogeneous solution for several times while stirring. After the solids were completely dissolved, the reaction was continued for 24 hours with stirring to obtain a viscous homogeneous polyamic acid resin (PAA-1) solution.

100 g of the above PAA resin solution was put into a 200 ml glass flask, 20 g of mixture of acetic anhydride and pyridine (2/1 molar ratio) was added under stirring. Then solution was mixed well uniformly, filtered by pressure and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 88.1% and 89.1%, respectively, the Tg is 346.5° C., and the coefficient of thermal expansion (CTE, 50-200° C.) is 53.3 ppm/° C., and the tensile modulus is 3.5 GPa.

Comparative Example 3

A 500 ml three-necked round bottom flask is equipped with a mechanical stirrer, a thermometer, and a nitrogen protection device. 200 ml of NMP (N-methylpyrrolidone), 9.61 g of (0.03 mol) TFDB (2,2'-bistrifluoromethyl-4,4'-diaminobiphenyl), and 29.98 g of (0.07 mol) 6FAPB (1,4-bis(2-trifluoromethyl-4-aminophenoxy)benzene) were added into the three-necked round bottom flask. All the solids were dissolved under stirring and nitrogen protection to form a homogeneous solution. After the round bottom flask was cooled to 0-5° C. with an ice bath, 22.62 g of (0.05 mol) 3FDA (4,4'-(trifluoromethylphenylisopropyl) and 16.11 g of (0.05 mol) BTDA (3,3',4,4'-benzophenone tetracarboxylic dianhydride) solid powder were added to the above homogeneous solution for several times while stirring. After the solids were completely dissolved, the reaction was continued for 24 hours with stirring to obtain a viscous homogeneous polyamic acid resin (PAA-1) solution.

100 g of the above PAA resin solution was put into in a 200 ml glass flask, 20 g of mixture of acetic anhydride and pyridine (2/1 molar ratio) was added under stirring. Then solution was mixed uniformly, filtered by pressure, and defoamed by vacuum. And then the resin solution was coated on the surface of the glass plate, heated to 60° C. for 1 h and 120° C. for 10 min. Then the semi-cured film formed was peeled off from the surface of the glass plate.

Then, the periphery of the semi-cured film was fixed on the stainless steel frame or under the biaxial stretching condition, the semi-cured film was treated at a high temperature at 250-350° C. for 1 h. A transparent polyimide film (25 μm) was obtained after cooling. The light transmittance of the polyimide film at 450 nm and 500 nm is 88.1% and 89.1%, respectively, the Tg is 346.5° C., and the coefficient of thermal expansion (CTE, 50-200° C.) is 53.3 ppm/° C., and the tensile modulus is 3.5 GPa. Table 1 shows the main properties of the polyimide films prepared in each embodiment and comparative example.

TABLE 1

The main properties of the transparent polyimide film with low thermal expansion

| | Transmittance (%) | | Tg | CTE | Tensile |
|---|---|---|---|---|---|
| | 450 nm | 500 nm | (° C.) | (ppm/° C.) | modulus (GPa) |
| Embodiment 1 | 85.6 | 88.6 | 354.6 | 4.2 | 6.4 |
| Embodiment 2 | 85.7 | 87.2 | 366.6 | 14.8 | 4.4 |
| Embodiment 3 | 88.2 | 92.4 | 352.6 | 17.2 | 4.0 |
| Embodiment 4 | 86.8 | 88.8 | 346.5 | 21.3 | 3.5 |
| Embodiment 5 | 85.4 | 88.4 | 387.3 | 12.6 | 5.6 |

TABLE 1-continued

The main properties of the transparent polyimide film with low thermal expansion

| | Transmittance (%) | | Tg | CTE | Tensile |
|---|---|---|---|---|---|
| | 450 nm | 500 nm | (° C.) | (ppm/° C.) | modulus (GPa) |
| Embodiment 6 | 92.5 | 96.8 | 355.0 | 18.0 | 4.8 |
| Embodiment 7 | 86.4 | 89.2 | 402.3 | 22.0 | 4.7 |
| Embodiment 8 | 83.4 | 88.7 | 373.4 | 2.4 | 7.0 |
| Embodiment 9 | 81.7 | 84.0 | 313.3 | −2.0 | 6.3 |
| Embodiment 10 | 81.4 | 84.0 | — | −17.0 | 17.2 |
| Comparative example 1 | 88.1 | 89.1 | 349.2 | 43.4 | 3.2 |
| Comparative example 2 | 86.8 | 88.8 | 346.5 | 53.3 | 3.6 |
| Comparative example 3 | 86.8 | 86.8 | 346.5 | 46.5 | 3.3 |

It can be seen from the above table 1 that the colorless and transparent polyimide film prepared in each embodiment not only has excellent transparency, but also has low thermal expansion coefficient, high modulus, and high glass transition temperature. The light transmittance at 450 nm is ≤80%, and the light transmittance at 500 nm is ≤82%, and the coefficient of thermal expansion (CTE, 50-200° C.) is ≥22 ppm/° C.

The difference between each comparative example and the embodiment of the present disclosure is that the monomer fluorine content of the comparative example is too high, resulting in large free volume and poor segment rigidity. Although the colorless and transparent polyimide film prepared by the comparative example has excellent transparency, its coefficient of thermal expansion is relatively high and cannot be used in flexible and transparent electronic packaging materials.

The above embodiments are merely preferred embodiments of the present disclosure and are not intended to limit the present disclosure in any form. Although the present disclosure has been disclosed as preferred embodiments described above, the preferred embodiments are not intended to limit the present disclosure. Without departing from the scope of the technical solution of the present disclosure, any person skilled familiar with the present patent can make some changes or modifications by using the technical contents indicated above to equivalent embodiments with equivalent changes, but any simple alterations, equivalent changes and modifications made to the above embodiments according to the technical essence of the present disclosure fall within the scope of the solution of the present disclosure without departing from the contents of the technical solution of the present disclosure.

The invention claimed is:

1. A polyimide film comprising a colorless transparent film with low thermal expansion, wherein the polyimide film is obtained by mixing raw materials to obtain a resin solution, wherein the raw materials comprise;
a first mixture of rigid aromatic diamine and fluorine-containing aromatic diamine, and a second mixture of rigid aromatic tetracarboxylic dianhydride and fluorine-containing aromatic tetracarboxylic dianhydride;
wherein the rigid aromatic diamine is 4,4'-diaminodiphenyl ether and the fluorine-containing aromatic diamine is 2,2'-bistrifluoromethyl-4,4'-diaminobiphenyl;
wherein a molar ratio of the 4,4'-diaminodiphenyl ether and the 2,2'-bistrifluoromethyl-4,4'-diaminobiphenyl is 10:90;
wherein the rigid aromatic tetracarboxylic dianhydride is 3,3'4,4'-biphenyltetracarboxylic dianhydride and the fluorine-containing aromatic tetracarboxylic dianhydride is 4,4'-(hexafluoroisopropyl) diphthalic anhydride;
wherein a molar ratio of the 4,4'-(hexafluoroisopropyl) diphthalic anhydride and the 3,3',4,4'-biphenyltetracarboxylic dianhydride is 10:90;
wherein an imidization reagent is added to a certain amount of the resin solution;
wherein the imidization reagent and the certain amount of resin solution are defoamed and evenly mixed to form a third mixture;
wherein the third mixture is coated on a plane and heated to from a semi-cured film;
wherein a solvent content in the semi-cured film is in the range from 10 wt % to 40 wt %; and
wherein the semi-cured film is peeled off and a high temperature treatment is conducted when a periphery of the semi-cured film is fixed or under an action of biaxial tension and cooled after an imidization reaction.

2. The polyimide film according to claim 1, wherein the raw materials comprise a molecular weight regulator, the molecular weight regulator is one or more components selected from a group consisting of phthalic anhydride, hydrogenated phthalic anhydride, 4-phenylacetylene phthalic anhydride, hydrogenated 4-toluene anhydride, 3-chlorophthalic anhydride, 3-bromophthalic anhydride, 4-chlorophthalic anhydride, 4-bromophthalic anhydride, perchlorophthalic anhydride, perbromophthalic anhydride, 3,4-dichlorophthalic anhydride, 3,4-dibromophthalic anhydride, aniline, 4-phenylethynylaniline and 3-phenylethynylaniline.

3. The polyimide film according to claim 1, wherein, a light transmittance at 450 nm is equal to about 85.6%, a light transmittance at 500 nm is equal to about 88.6%, a thermal expansion coefficient of 50-200° C. is equal to about 4.2 ppm/° C., a tensile modulus is equal to about 6.4 GPa, and Tg is equal to about 354.6° C.

4. A method for using the polyimide film according to claim 1, as a part of a flexible photoelectric display substrate, a printed circuit board or an electronic packaging substrate, comprising activating the polyimide film.

5. The method according to claim 4, wherein, the polyimide film on which an oxide electrode layer or a metal layer is deposited after the surface of the polyimide film is activated, is applied as the flexible photoelectric display substrate or the transparent flexible printed circuit board or the flexible electronic packaging substrate.

6. A method for preparing a polyimide film with colorless, transparent and low thermal expansion, comprising:
(1) adding a solid powder of a mixture of rigid aromatic diamine and fluorine-containing aromatic diamine to an organic solvent to obtain a first homogeneous solution, adding a solid powder of a mixture of rigid aromatic tetracarboxylic dianhydride and fluorine-containing aromatic tetracarboxylic dianhydride to the first homogeneous solution for several times, stirring to form a second homogeneous solution, adding a molecular weight regulator to the second homogeneous solution and continuing stirring to obtain a polyamic acid resin solution;
wherein the rigid aromatic diamine is 4,4'-diaminodiphenyl ether and the fluorine-containing aromatic diamine is 2,2'-bistrifluoromethyl-4,4'-diaminobiphenyl, wherein a molar ratio of the 4,4'-diaminodiphenyl ether and the 2,2'-bistrifluoromethyl-4,4'-diaminobiphenyl is 10:90;

wherein the fluorine-containing aromatic tetracarboxylic dianhydride is 4,4'-(hexafluoroisopropyl) diphthalic anhydride and the rigid aromatic tetracarboxylic dianhydride is 3,3',4,4'-biphenyltetracarboxylic dianhydride or pyromellitic dianhydride;

wherein a molar ratio of the 4,4'-(hexafluoroisopropyl) diphthalic anhydride and the 3,3',4,4'-biphenyltetracarboxylic dianhydride is 10:90 or a molar ratio of the 4,4'-(hexafluoroisopropyl) diphthalic anhydride and the pyromellitic dianhydride is 30:70;

(2) adding an imidization reagent to a certain amount of the polyamic acid resin solution being subject to defoaming in vacuum, mixing evenly to form a mixture, coating the mixture on a plane, heating to form a semi-cured film, wherein a solvent content in the semi-cured film is in a range from 10 wt % to 40 wt %;

(3) peeling off the semi-cured film, conducting high temperature treatment when a periphery of the semi-cured film is fixed or under an action of biaxial tension, and cooling after imidization reaction to obtain a polyimide film that is colorless and transparent.

7. The method according to claim 6, wherein, the organic solvent is one or more solvents selected from a group consisting of N-methylpyrrolidone, N,N'-dimethylacetamide, N,N'-dimethylformamide, dimethylsulfoxide, γ-butyrolactone, ethyl lactate, cyclopentanone, cyclohexane ketone, methyl ethyl ketone, ethyl acetate and butyl acetate.

8. The method according to claim 6, wherein, the imidization reagent is a mixture of organic acid anhydride and organic base, selected from a mixture of acetic anhydride and pyridine, a mixture of acetic anhydride and 2-methylpyridine, a mixture of acetic anhydride and 3-methylpyridine, a mixture of acetic anhydride and 4-methylpyridine, a mixture of acetic anhydride and 2,3-lutidine, a mixture of acetic anhydride and 2,4-lutidine, a mixture of acetic anhydride and 2,6-lutidine, a mixture of acetic anhydride and quinoline, a mixture of acetic anhydride and isoquinoline and a mixture of acetic anhydride and pyrrole.

9. The method according to claim 6, wherein, an amount of the imidization reagent added is greater than 0% and less than 100% of a weight of the polyamic acid resin solution.

10. The method according to claim 6, wherein, a temperature of high temperature treatment is in a range from 200° C. to 450° C., a treatment time is in a range from 1 min to 120 min, and a thickness of the polyimide film is in a range from 7.5 μm to 100 μm.

11. The method according to claim 6, wherein, the molecular weight regulator is one or more components selected from a group consisting of phthalic anhydride, hydrogenated phthalic anhydride, 4-phenylacetylene phthalic anhydride, hydrogenated 4-toluene anhydride, 3-chlorophthalic anhydride, 3-bromophthalic anhydride, 4-chlorophthalic anhydride, 4-bromophthalic anhydride, perchlorophthalic anhydride, perbromophthalic anhydride, 3,4-dichlorophthalic anhydride, 3,4-dibromophthalic anhydride, aniline, 4-phenylethynylaniline and 3-phenylethynylaniline.

12. A polyimide film comprising a colorless transparent film with low thermal expansion, wherein the polyimide film is obtained by mixing raw materials to obtain a resin solution, wherein the raw materials comprise:

a first mixture of rigid aromatic diamine and fluorine-containing aromatic diamine, and a second mixture of rigid aromatic tetracarboxylic dianhydride and fluorine-containing aromatic tetracarboxylic dianhydride;

wherein the rigid aromatic diamine is 4,4'-diaminodiphenyl ether and the fluorine-containing aromatic diamine is 2,2'-bistrifluoromethyl-4,4'-diaminobiphenyl;

wherein a molar ratio of the 4,4'-diaminodiphenyl ether and the 2,2'-bistrifluoromethyl-4,4'-diaminobiphenyl is 10:90;

wherein the rigid aromatic tetracarboxylic dianhydride is pyromellitic dianhydride and the fluorine-containing aromatic tetracarboxylic dianhydride is 4,4'-(hexafluoroisopropyl) diphthalic anhydride;

wherein a molar ratio of the 4,4'-(hexafluoroisopropyl) diphthalic anhydride and the pyromellitic dianhydride is 30:70;

wherein an imidization reagent is added to a certain amount of the resin solution;

wherein the imidization reagent and the certain amount of resin solution are defoamed and evenly mixed to form a third mixture;

wherein the third mixture is coated on a plane and heated to from a semi-cured film;

wherein a solvent content in the semi-cured film is in the range from 10 wt % to 40 wt %; and wherein the semi-cured film is peeled off and a high temperature treatment is conducted when a periphery of the semi-cured film is fixed or under an action of biaxial tension and cooled after an imidization reaction.

13. The polyimide film according to claim 12, wherein, a light transmittance at 450 nm is 85.4%, a light transmittance at 500 nm is 88.4%, a thermal expansion coefficient of 50-200° C. is 12.6 ppm/° C., a tensile modulus is 5.6 GPa, and Tg is 387.3° C.

14. A method for using the polyimide film according to claim 12 as a part of a flexible photoelectric display substrate, a printed circuit board or an electronic packaging substrate, comprising activating the polyimide film.

15. The method according to claim 14, wherein, the polyimide film on which an oxide electrode layer or a metal layer is deposited after the surface of the polyimide film is activated, is applied as the flexible photoelectric display substrate or the transparent flexible printed circuit board or the flexible electronic packaging substrate.

* * * * *